United States Patent

Geyer et al.

[15] 3,698,620

[45] Oct. 17, 1972

[54] APPARATUS FOR CONNECTING LEAD PORTIONS OF A LEAD FRAME TO RESPECTIVE PADS ON A CHIP

[72] Inventors: Harry J. Geyer, Phoenix, Ariz.; Robert W. Helda, Hollywood, Fla.

[73] Assignee: Motorola, Inc., Franklin Park, Ill.

[22] Filed: March 25, 1970

[21] Appl. No.: 22,445

[52] U.S. Cl. ..........................228/6, 29/203, 29/577, 228/1, 228/3

[51] Int. Cl. ............................B23k 1/00, B23k 5/00

[58] Field of Search .......228/1, 3, 3.5, 4, 5; 219/148; 29/470, 626, 592, 203, 577

[56] References Cited

UNITED STATES PATENTS

| | | | |
|---|---|---|---|
| 3,451,607 | 6/1969 | Miller et al. | 228/1 |
| 3,533,155 | 10/1970 | Coucoulas | 29/407 X |
| 3,556,912 | 1/1971 | Burgo et al. | 228/1 X |
| 3,568,301 | 3/1971 | Shibata | 29/498 X |

*Primary Examiner*—John F. Campbell
*Assistant Examiner*—R. J. Craig
*Attorney*—Mueller, Aichele & Gillman

[57] ABSTRACT

Wire bonding is eliminated in the assembly of a microelectronic chip having bonding pads by a process involving the direct bonding of the bonding pads to the ends of respective inwardly extending leads comprising portions of a frame member. A machine is provided for properly positioning a chip with respect to a frame member and for simultaneously bonding of all leads to the ends of all the bonding pads of a semiconductor integrated circuit chip in one step. Many frame members are provided in a strip which may be supplied rolled up on a reel. After the pads on the chip are bonded to the ends of the leads of the frame member, the strip may be rolled on another reel and transported to another machine for performing another step or other steps thereon.

12 Claims, 9 Drawing Figures

Figure 1:
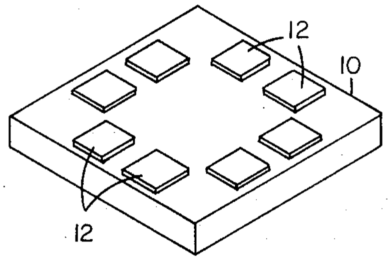

INVENTOR.

Robert W. Helda and
Harry J. Geyer

BY Mueller, Aichele & Rauner

ATTY'S.

INVENTOR.
Robert W. Helda and
Harry J. Geyer
BY
Mueller, Aichele & Rauner
ATTY'S.

APPARATUS FOR CONNECTING LEAD PORTIONS OF A LEAD FRAME TO RESPECTIVE PADS ON A CHIP

BACKGROUND

The subject matter of the present application is related to other pending applications owned by Motorola, Inc., the assignee of the present application including that of a continuation application of Robert W. Helda, Ser. No. 80,378 filed Oct. 13, 1970, a continuation application of Robert W. Helda and Harry Geyer, Ser. No. 58,081 filed June 29, 1970, and a further continuation application of Robert W. Helda, Ser. No. 203,007 filed Nov. 29, 1971.

This invention relates to bonding of bonding pads on chips, which have electric circuits applied thereto, to leads which comprise parts of a lead frame.

Various methods have been proposed for providing electrical connections between the ohmic contact areas or bonding pads of an integrated circuit chip and the external package leads. The most common method involves the thermal compression bonding of extremely fine wires between the bonding pads on the chip and the leads of the package. In accordance with this technique, a 14 lead device, for example, requires a 28 separate bonding steps, each requiring a careful positioning of the partially assembled device in the bonding apparatus.

The industry has recognized for some time that it would be desirable to eliminate the time and expense of wire bonding. Considerable attention has been devoted to the expedient of simply extending the internal portions of the package leads and tapering of the lead ends to provide bonding tips which are small enough for attachment directly to the bonding pads of the semiconductor circuit deposited on the chip. This approach has not been successful primarily due to the fundamental difference in structural specifications required for external package leads as compared with the specifications required of internal leads bonded to the ohmic contact bonding pads of the chip.

For example, the use of external package leads made of 10 mil Kovar has become the standard practice for many devices. Efforts to bond 10 mil Kovar leads directly to the bonding pads of the chip have proved disappointing. High speed techniques for gold or aluminum wire bonding, such as thermal compression bonding and vibratory pressure bonding, does not readily produce a reliable bond when applied to leads as thick as 10 mils, or when applied to metal leads which are less ductile than gold, aluminum, or copper, for example. Even when acceptable bonds are initially formed using a 10-mil lead frame, the leads are very susceptible to inadvertent detachment from the bonding pads as a result of subsequent stresses introduced by normal handling and incidental flexing of the assembly.

It has been proposed to replace the bonding wires with individual rigid metal clips for interconnecting the bonding pads of the semiconductor circuit with the external leads. This approach may be advantageous for some applications, but it has not been found to reduce the cost of the assembly substantially.

A very thin lead frame having internally extending leads, one for each bonding pad on the chip, has been developed for connecting the respective bonding pads to the package leads. The lead frame may be made of aluminum which is 2 mils thick and is therefore very pliable. A good many lead frames may be formed into a strip and the strip may be supplied rolled up on a reel. For bonding the inner ends of the leads of the lead frames to the bonding pads on the chips, the lead frame is supplied in such form that when a chip is put over a lead frame, the chip can be so positioned that the inner ends of the leads register with the bonding pads. After such positioning, each lead end can be bonded to a respective bonding pad by thermal compression bonding or vibratory pressure bonding. Such registering of lead frame lead ends and bonding pads is very difficult and time consuming since not only must the chip and the lead frame be properly registered with respect to each other but they must be positioned on an anvil and the back of the chip must be in line with the bonding post. It is noted that a typical chip may be about one-thirtieth of an inch square and may have about 24 bonding pads thereon and that the leads comprising part of the lead frame is of commensurate size, whereby the difficulty of doing a proper bonding job is highlighted.

It is an object of this invention to provide an improved apparatus for registering lead ends of a lead frame with bonding pads on a chip, and for bonding the lead ends to the respective pads.

SUMMARY

The lead frames are supplied in strip form whereby a great many frames are supplied in one strip. The strip may be provided wound up on a reel. The strip is advanced one reel frame at a time to a position where the inner ends of the leads of a lead frame is over an anvil. A chip is positioned face down and is roughly oriented, within about 15 percent of its final orientation, on a transparent plate and over a hole in a support. The face of the chip is scanned by means of a light sensitive cell through the hole and the scanned image is compared with a picture of the face of the chip. If the chip is not positioned properly in the X and Y direction on the plate and also properly angularly or theta oriented, the scanned image will not correspond to the picture. Means are provided to move the support of the plate in the X, Y and theta or angular direction until the scanned image and the picture are identical. If desired, the scanning of the chip may be omitted, and the face of the chip, which as noted above, faces down, may be observed by means of a known optical instrument and the final positioning of the chip may be made manually. Or the back of the chip which is observed may have orienting indicia thereon for final positioning. Or, if desired, the chip may be precision sawed to provide square corners and positioning may be made with reference to the corners. Suction is applied to a bonding post and the bonding post picks up the properly positioned and oriented chip (hereinafter positioned) and places it on the center portion of the lead frame whereby it is over the anvil and whereby the ends of the leads register with respective pads on the chip. The post then applies pressure and vibratory force to the back of the chip, whereby the individual lead ends are bonded to their respective pads. Due to the fact that the outer ends of the leads are confined by the lead frames and that the inner ends of the leads are compressed during the bonding, the leads become longer and each of the leads buckles providing a small loop or hump in each lead, which prevents shorting of a lead to the chip as the leads cross the corners of the chip. The loop also allows the lead frame to be handled or flexed without inducing any stresses at the bonding pad area.

DESCRIPTION

Figure 2:
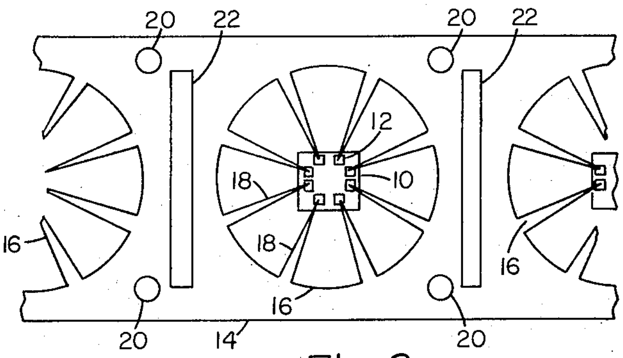
Figure 3:
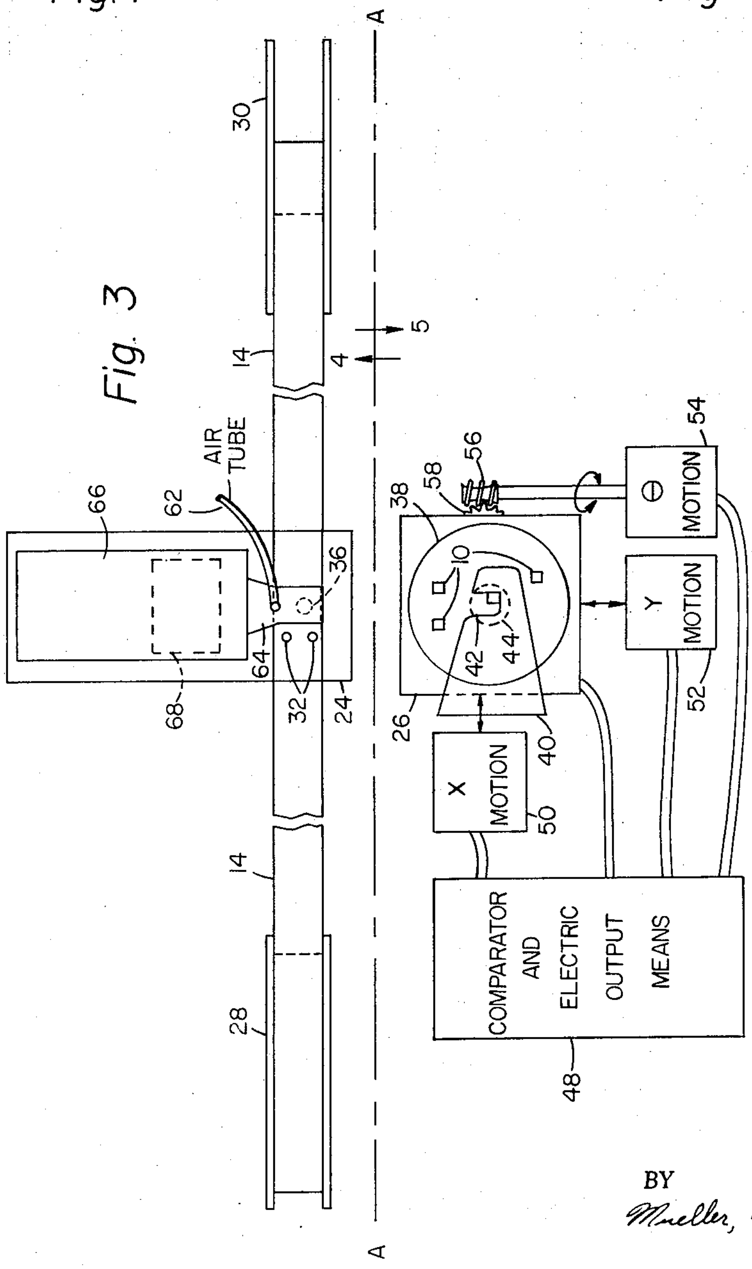
Figure 6:
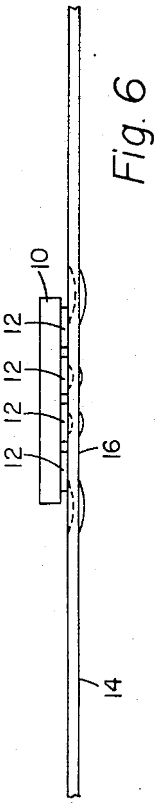
Figure 4:
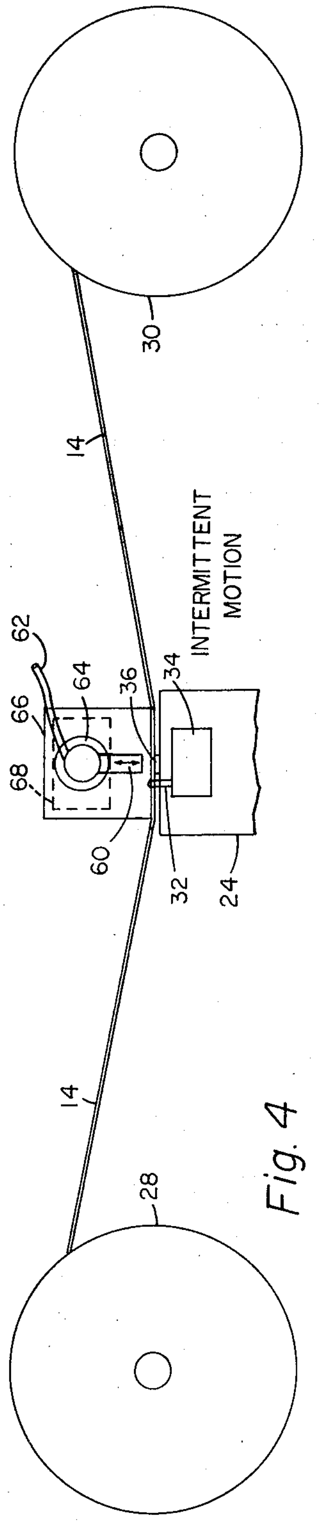
Figure 7:
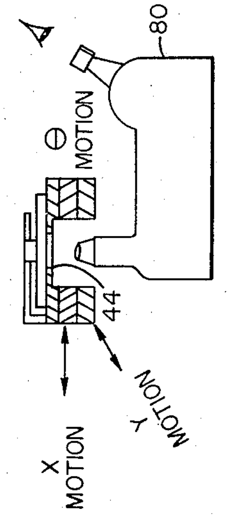
Figure 8:
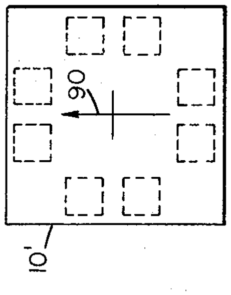
Figure 5:
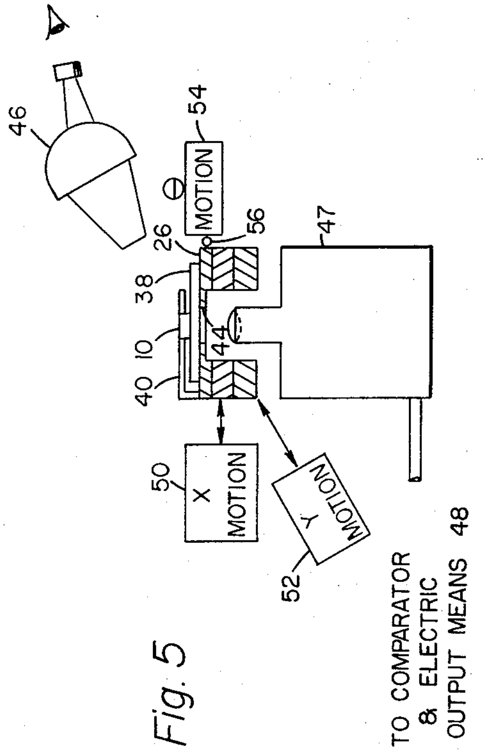
Figure 9:
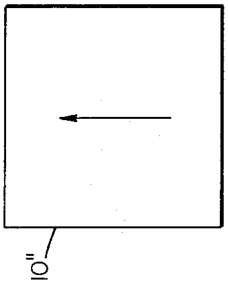

The invention will be better understood upon reading the following description in connection with the accompanying drawing in which:

FIG. 1 illustrates a chip having bonding pads thereon,

FIG. 2 illustrates a strip of lead frames and also shows a chip with its bonding pads bonded to the ends of the individual inwardly extending leads of the lead frame, FIG. 3 is a plan view of a semi-automatic machine for bonding the ends of the leads to the bonding pads, FIG. 4 is a view of the machine of FIG. 3 on the line A—A and looking in the direction of the arrow 4, FIG. 5 is a view of the machine of FIG. 3 on the line A—A and looking in the direction of the arrow 5, FIG. 6 shows a view of the chip and the lead frame attached thereto and the loops produced in the leads when the leads are bonded to the chips, FIG. 7 illustrates optical means for positioning the chip by observing the bottom thereof, and FIGS. 8 and 9 illustrate views of the backs of modified chips to be bonded to the leads of the frames of FIG. 1.

Turning first to FIG. 1, the top of a chip 10 is shown. Besides having a circuit (not shown) deposited on the face of the chip, a number of bonding pads 12 are applied to the chip along the edge but spaced slightly inwardly from the edge of the chip. The bonding pads 12 are terminals for the circuit on the chip. The pads 12 may be raised about 1 to 2 microns above the surface of the chip. While eight pads 12 are shown, any number thereof may be used, 24 being typical number thereof.

As shown in FIG. 2, a strip 14 of lead frame 16 is provided. While only one lead frame and two partial lead frames 16 are shown in FIG. 2, it will be understood that as many lead frames 16 are provided in the strip 14 as is convenient. Since the lead frames of FIG. 2 are to be used with the chips of FIG. 1, the lead frames 16 include eight inwardly extending leads 18 and the inner ends of the leads 18 register with the pads 12 on a chip 10 when the chip 10 is properly oriented and positioned with respect to the frame 16. There will be as many leads 18 in a frame 16 as is required to make proper connections to the various pads 12 on the chip 10. The strip 14 is very flexible, being of aluminum about 2 mils thick, whereby it can be supplied in a reel. Furthermore, since the chip 10 is so small with respect to the frame 16 in which it is connected, after the bonding pads 12 of the chip 10 have been bonded to the inner ends of the leads 18, as shown in FIG. 2, the strip 14 with the chips 10 bonded thereto may be rolled on another reel for transportation without harming the frame 16, the leads 18 or the chip 10 or their connections.

Since the leads 18 are very flexible, when they are bonded to the pads 12, handling of the strip 14 with the chips attached thereto or handling of the chips 14 with the leads 18 attached thereto in further steps in the process, will not destroy or harm the connection of the leads 18 to the pads 12. Holes 20 are provided in the strip 14 for registration and motion of the strip 14 as will be explained. Slots 22 are provided part way through the strip 14 and between each frame 16 and another adjacent frame for the purpose of making the strip 14 uniformly flexible along the length thereof.

The inventive machine for bonding the leads 18 to the pads 12 is shown in FIGS. 3, 4 and 5. The tops of the tables 24 and 26 are in the same plane and in the respective positions shown in FIG. 3. For clearness of illustration, tables 24 and parts associated therewith are shown in FIG. 4 while the table 26 and parts associated therewith are shown in FIG. 5.

A reel 28 of the strip 14 is mounted for rotation in a known manner to one side of the table 24 and a reel 30 for taking up the strip 14 with chips 10 bonded thereto is mounted to the other side of the table 24, whereby the strip runs along and over the table 24. Strip locating and strip moving pins 32 project up through the top of the table 24 and extend through a pair of holes 20,20 in the strip 14. An intermittent motion 34, see FIG. 4, is provided for moving the pins 32 and therefore the strip 14 to the right as viewed in FIGS. 3 and 4 the distance between two frames 16, whereby the inwardly extending ends of the leads 18 are located on top of an anvil 36 which extends up through the top of the table 24.

A vibratory bonding post 60, see FIG. 4, which also acts as a transport means, is mounted on the table 24. The post 60 is hollow and suction may be applied thereto by an air tube 62. The post 60 is mounted on the end of a cylinder 64 and is moveable up and down with respect to the cylinder 64 by known means such as a cam or air pressure means not shown. The cylinder 64 is moveable in and out of a housing 66 which is mounted on the table 24. A vibrator 68 is positioned in the housing 66 in such a manner as, by vibrating the slide or cylinder 64, to vibrate the post 60 when the vibrator 68 is turned on. As will be further described, the post 60 is moved by moving the slide or cylinder 64 by a known mechanism (not shown) between the position where it is over a properly oriented and properly positioned chip 10 on the table 26 to a position where it is over the anvil 36, and the post 60 will be made to go down and will apply vibration and pressure to the chip 10 to cause bonding of the pads 12 on the chip 10 to the ends of the leads 18 with which they are in contact. The means for positioning and orienting a chip 10 is shown in FIGS. 3 and 5.

As shown in FIGS. 3 and 5, a transparent dish 38 of chips 10 is placed on the table 26. The chips 10 are upside down on the dish 38. A fixed locating plate 40 having a locating notch 42 therein is positioned overhanging the table 26 and the dish 38 of chips 10. The plate 40 may be fixed in position in any known manner (not shown). A hole 44 is provided through the table 38 under the locating notch 42. A binocular microscope 46 is provided to help see the chips 10 and to help position them with respect to the notch 42 as will be further explained. An optical scanner 47 of known design is positioned under the hole 44 in the table 26, the output of the optical scanner 46, which is under the table 26 and therefore is not shown in FIG. 3, feeding a comparator output means 48. While the dish 38 can be moved and rotated manually with respect to the table 26, the table 26 is itself mounted for X, Y and *theta* motion by motors 50, 52 and 54 respectively. The motor 54 rotates a worm gear 56 which meshes with worm wheel 58, which is fixed to the table 26. The electrical controls for the X, Y and theta motion motors 50, 52 and 54 is supplied by the electrical output of the comparator 48.

An operator looks through the telescope 46 and either by moving the dish 38 or by moving a chip 10 places the chip in the corner, the lower right hand corner as shown in FIG. 3 of the locating notch 42 in the locating plate 40. This orientation and positioning is quite rough since the operator only sees the back of the chip, since the chips are not identical in size, and since the face of the chip is down. However, since the circuit that is deposited on a chip is not normally symmetrical about a center point, the chips on the dish 38 must be all oriented roughly in the same direction before any chip 10 is put in the notch 44, that is the "-tops" of all the chips must be pointed in or directed in the same general direction before they can be operated on properly by the described machine.

When a chip 10 is positioned in a corner of the locating notch 42, the optical scanner 47 and the comparator 48 are turned on, and the pattern on the chip 10, which, as noticed above, is directed downwardly, will be compared with a picture image in a known manner. The error voltage will be applied to the X, Y and theta motion motors 50, 52 and 54 to exactly orient and position the pattern on a chip as viewed by the scanner with respect to the picture image in the comparator 48. Then, the extendable bonding post carrier cylinder 64 slides in the housing 66 towards the chip in the notch 42 until the post 60 is directly over the chip 10 in the notch 42. The post 60 goes down and suction is applied by way of the air tube 62 and the chip is picked up and the post 60 goes up and the post carrier cylinder 64 goes back to its original position where the post 60 is directly over the anvil 36 and therefore over the frame 16. The post 60 goes down to press the chip 10 down on the frame 16 which is itself on the anvil 36 and vibratory means 68 for the post 60, which is built into the housing 66, is turned on and each of the inner ends of the leads on the frame 16 are bonded simultaneously to a respective bonding pad 12 on the chip. The air suction and vibration are turned off, the post 60 goes up and the pins 32 move to the right far enough to put another frame 16 into the bonding position over the anvil 36 and the cycle is repeated. As shown in FIG. 6, the bonding of the ends of the lead frame 16 to the pads 12 on the chip 10 causes humping or bending the leads, due to the fact that the leads are lengthened by the pressure applied thereto during bonding combined with the fact that outer ends of the leads 18 are confined by the frame 16.

If desired, as shown in FIG. 7, the optical scanner 47 and the automatic positioning and orienting apparatus of FIG. 5 may be omitted. Then instead of a microscope such as 46 of FIG. 5, a known modified microscope 80 may be provided. The operator looks down in the microscope 80 and sees the face of the chip 10, which as noted above is downward, through the hole 44 in the table 26, and locates the chip pads with respect to a reticle in the scope 80. This may be accomplished by manually moving the dish 38 or a chip 10. Then, when the chip 10 has been closely positioned, the post 60 picks up positioned chip 10 and puts it on the frame 16 which is above the anvil 36 and the bonding process continues.

Or by use of a chip 10 ' and 10 '' such as those FIGS. 8 and 9 respectively, manual final or close positioning may take place, the scanner 47 and automatic positioner of FIG. 5 again being omitted. A microscope such as that of 46 of FIG. 5 may be used. FIG. 8 shows the back of a chip 10 ' with orienting indicia 90 thereon. The chip 10 ' is closely oriented and positioned by observing the back of the chip through the microscope 46 and positioning the indicia 90 with respect to a reticle in the microscope. The chip 10 '' of FIG. 9 has an arrow on the back thereof pointing to the "top" of the chip. The chip 10 '' is precision sawed, whereby all chips 10 '' are the same size and shape, whereby the chip 10 '' may be positioned with respect to the notch 42 in the plate 40. The process of bonding after final or close positioning is as above.

When the strip 14, now including chips 10 bonded to the frame 16 is all wound up upon the reel 30, the reel 30 may be transported to another machine for further operations thereon.

What is claimed is:

1. Apparatus for bonding in a single bonding operation a plurality of conductive lead portions to a plurality of contact portions on an electrical unit, said conductive lead portions being arranged in a group around a central area and separated from one another to serve ultimately as conductors from said electrical unit, with said group being one of a plurality of such groups spaced apart from one another over the length of a member, said apparatus including means for intermittently moving said member through the apparatus to place a group of conductive lead portions one group at a time in a fixed position for a bonding operation of said group of lead portions and corresponding contact portions of an electrical unit, anvil means at said fixed position in the apparatus, supporting means in the apparatus for an electrical unit while it is being aligned to a bonding position, connecting means for said supporting means, an optical system for viewing the electrical unit while it is being aligned, means selectively moving said connecting means to in turn move said supporting means to place said electrical unit in an aligned position, while being viewed in said optical system, bonding means having suction means therewith maintaining an aligned electrical unit at the bonding end of said bonding means, means providing relative vertical movement of at least one of the bonding means and anvil means to bring the contact portions of an electrical unit and the corresponding conductive lead portions of a group into pressured engagement for a bonding operation, means energizing the bonding means to perform a bonding operation of the contact portions of the electrical unit and a group of conductive lead portions, means permitting the bonding means and anvil means to separate after a bonding operation, and means energizing the means for intermittently moving said member to place another group of conductive lead portions in position for a corresponding bonding operation.

2. Apparatus as defined in claim 1 having a pair of reels therewith, with one reel adapted to have a member thereon for movement of such member through the apparatus from one fixed position to a successive fixed position, and with the second reel adapted to have said member reeled thereon after the conductive portions of a group with such member are bonded to the contact portions of an electrical unit.

3. Apparatus as defined in claim 1 including means for supplying a member to said apparatus for successive bonding operations of successive groups of conductive portions to respective electrical units, and means for accumulating such a member thereon for independent handling of such member after such successive bonding operations.

4. Apparatus as defined in claim 1 wherein said supporting means includes a structure for supporting a plurality of electrical units thereon for the successive alignment of each such unit relative to a final position in the apparatus for the bonding operation of each such unit.

5. Apparatus as defined in claim 1 having aligning means operatively connected to said optical system and said supporting means, and means for energizing said aligning means to move said supporting means whereby an electrical unit on said supporting means is aligned relative to a bonding position for such unit.

6. Apparatus as defined in claim 1 having a portion in the supporting means such that the placement of an electrical unit on such portion will initiate the movement of the supporting means to move an electrical unit to an aligned position.

7. Apparatus as defined in claim 1 having means associated with said optical system whereby said optical system can observe an electrical unit in a first position and in a second position in bringing said unit to a bonding position.

8. Apparatus as defined in claim 1 having X, Y and theta motion producing means for cooperation with the optical system to accomplish the alignment of an electrical unit for a bonding operation.

9. Apparatus as defined in claim 8 having means for energizing said X, Y and theta motion producing means incident to the use of the optical system for electrical unit aligning.

10. Apparatus as defined in claim 1 wherein said supporting means includes a transparent plate upon which said plurality of electrical units are supported for viewing by the optical system through said transparent plate.

11. Apparatus as defined in claim 1 adapted to accommodate a member in strip form for the bonding operations including a table portion over which said member is moved and upon which it is supported in a fixed position for the bonding operation, and reel means upon which to wind a member after electrical units are bonded thereto.

12. Apparatus as defined in claim 1 wherein said means selectively moving said connecting means is manually operable to move said supporting means, and the optical system includes a microscope for viewing of the electrical unit by the operator doing the manual operating to move the supporting means.

* * * * *

UNITED STATES PATENT OFFICE
CERTIFICATE OF CORRECTION

Patent No. 3,698,620 Dated October 17,1972

Inventor(s) Harry J. Geyer, et. al.

It is certified that error appears in the above-identified patent and that said Letters Patent are hereby corrected as shown below:

Column 1, line 12, "58,081" should read -- 56,081 -- ; line 25, before "28", cancel "a". Column 5, line 57, after "that" insert -- the -- . Column 6, line 6, insert -- of -- after "those".

Signed and sealed this 20th day of March 1973.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334.